United States Patent
Chan et al.

(10) Patent No.: US 10,522,427 B2
(45) Date of Patent: Dec. 31, 2019

(54) TECHNIQUES PROVIDING SEMICONDUCTOR WAFER GROUPING IN A FEED FORWARD PROCESS

(75) Inventors: Tsun-Jen Chan, Pingzhen (TW); Yh-Hsiu Hsiao, Zhunan Township, Miaoli County (TW); Lu Cheng-Ta, Guishan Township, Taoyuan County (TW); Jian-Hong Wu, Tainan (TW)

(73) Assignee: TAIWAN SEMICONDUCTOR MANUFACTURING COMPANY, LTD., Hsin-Chu (CN)

( * ) Notice: Subject to any disclaimer, the term of this patent is extended or adjusted under 35 U.S.C. 154(b) by 601 days.

(21) Appl. No.: 13/177,395

(22) Filed: Jul. 6, 2011

(65) Prior Publication Data
US 2013/0011939 A1   Jan. 10, 2013

(51) Int. Cl.
*H01L 21/66* (2006.01)
*G05B 19/418* (2006.01)

(52) U.S. Cl.
CPC ........ *H01L 22/20* (2013.01); *G05B 19/41865* (2013.01); *G05B 2219/32298* (2013.01); *G05B 2219/45031* (2013.01); *H01L 22/12* (2013.01); *H01L 2924/0002* (2013.01); *Y02P 90/20* (2015.11)

(58) Field of Classification Search
CPC .............. H01L 22/20; G05B 19/41865; G05B 19/41895
USPC ........................................................ 700/99
See application file for complete search history.

(56) References Cited

U.S. PATENT DOCUMENTS

| | | | |
|---|---|---|---|
| 7,046,332 B2 * | 5/2006 | Kuo et al. | 355/53 |
| 7,302,305 B2 * | 11/2007 | You et al. | 700/102 |
| 7,631,286 B2 * | 12/2009 | Piper et al. | 716/52 |
| 7,982,155 B2 * | 7/2011 | Asano | 209/572 |
| 8,145,337 B2 * | 3/2012 | Lin et al. | 700/108 |
| 8,204,297 B1 * | 6/2012 | Xiong et al. | 382/149 |
| 2003/0180972 A1 * | 9/2003 | Al-Bayati | H01L 21/67253 438/14 |
| 2004/0030430 A1 * | 2/2004 | Matsuoka | 700/108 |
| 2004/0159397 A1 * | 8/2004 | Bode | G03F 7/70525 156/345.5 |
| 2005/0221596 A1 * | 10/2005 | You et al. | 438/598 |
| 2006/0087007 A1 * | 4/2006 | Arai | H01L 21/30604 257/620 |
| 2007/0277861 A1 * | 12/2007 | Hiroe | H01L 21/67086 134/56 R |
| 2008/0275676 A1 * | 11/2008 | Lin et al. | 703/2 |
| 2009/0008794 A1 * | 1/2009 | Wu | B24B 7/228 257/777 |
| 2009/0098707 A1 * | 4/2009 | Nishihata | H01L 21/76256 438/455 |

(Continued)

*Primary Examiner* — Vincent H Tran
(74) *Attorney, Agent, or Firm* — Haynes and Boone, LLP

(57) ABSTRACT

A method for processing a plurality of semiconductor wafers includes acquiring a process parameter measurement for each of the semiconductor wafers, associating each of the semiconductor wafers with one of a plurality of groups based on a respective process parameter measurement for each of the semiconductor wafers, where each respective group corresponds to a respective recipe, and for each one of the groups, processing ones of the semiconductor wafers associated with that group together according to a respective recipe.

20 Claims, 2 Drawing Sheets

(56) References Cited

U.S. PATENT DOCUMENTS

| | | | | |
|---|---|---|---|---|
| 2011/0089088 A1* | 4/2011 | Beffa | ............... | B07C 5/3412 |
| | | | | 209/552 |
| 2011/0244652 A1* | 10/2011 | Yamazaki | ......... | H01L 21/02046 |
| | | | | 438/458 |
| 2011/0256728 A1* | 10/2011 | Hiroe | ............... | H01L 21/67086 |
| | | | | 438/745 |

* cited by examiner

TECHNIQUES PROVIDING SEMICONDUCTOR WAFER GROUPING IN A FEED FORWARD PROCESS

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

During wafer processing, various techniques may be used during a multi-step process. One technique includes a Feed Forward (FFW) process. In one example FFW process, information from a previous step is used to define a process condition in a subsequent step. The subsequent step includes a job on a given processing tool. A FFW process can in some instances reduce wafer-to-wafer variation (e.g., as measured by a Wafer Acceptance Test), but may create multiple process jobs for each wafer and increase process time, as explained below.

Some FFW processes use a wafer-base mode, where process conditions are defined for each wafer. A benefit of a wafer-base mode is a decrease in wafer-to-wafer variation. However, a wafer-base mode may lead to each wafer requiring its own process job at a given process step, which may greatly increase the time to process each lot. For instance, in a wafer-base mode, each wafer is assigned its own recipe for a process step at a tool. At the tool, the wafers are processed one-by-one to apply the individual recipes.

By contrast, a lot-base mode measures data from only a subset of wafers in a lot and approximates that data to the other wafers in the lot. Then, the wafers in the lot are subjected to a process job. In other words, for a particular step the same recipe is applied to the wafers in the lot, so the entire lot can be processed in the processing tool at the same time (assuming that the tool has capacity to accommodate the entire lot). A benefit of a lot-base mode is that it decreases the number of process jobs, thereby decreasing the time to process each lot. However, a lot-base mode may have increased wafer-to-wafer variation. It would be desirable to decrease both processing time and wafer-to-wafer variation. Thus, while some processing techniques may be satisfactory in some aspects, various processing techniques can use improvement.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

Figure 1:
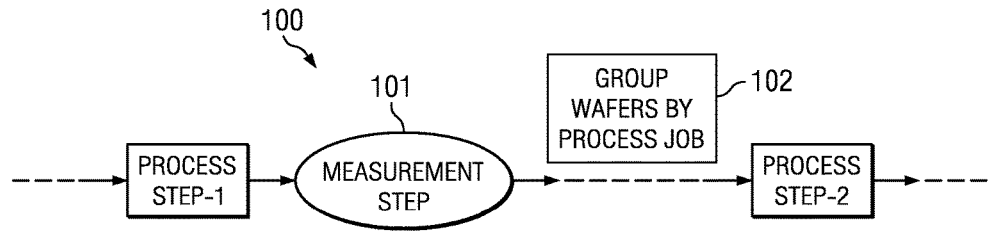
FIG. 1 is an illustration of an exemplary process for manufacturing semiconductor wafers in accordance with various aspects of the present disclosure.

One of the broader forms of the present disclosure involves a method for processing a plurality of semiconductor wafers includes acquiring a process parameter measurement for each of the semiconductor wafers, associating each of the semiconductor wafers with one of a plurality of groups based on a respective process parameter measurement for each of the semiconductor wafers, where each respective group corresponds to a respective recipe, and for each one of the groups, processing ones of the semiconductor wafers associated with that group together according to a respective recipe.

Another one of the broader forms of the present disclosure involves a method for manufacturing a plurality of semiconductor wafers includes receiving a batch of semiconductor wafers and generating process parameter data for each of the semiconductor wafers. The process parameter data for a respective semiconductor wafer indicates a process condition in a subsequent step for the respective semiconductor wafer. The method further includes dividing the batch into a plurality of groups, each one of the groups including ones of the semiconductor wafers associated with a same process condition and processing the batch group-by-group in the subsequent step.

Still another one of the broader forms of the present disclosure involves a computer program product having a computer readable medium tangibly recording computer program logic for controlling a semiconductor manufacturing process includes code to analyze process parameter data for each of a plurality of semiconductor wafers and code to associate each of the semiconductor wafers with a respective one of a plurality of groups, where each respective one of the groups is associated with a different recipe in a subsequent processing step. The computer program product also includes code to process the semiconductor wafers in the subsequent processing step group-by-group.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity.

Various embodiments include methods, systems, and computer program products for process job grouping of semiconductor wafers in a FFW process system. In one example embodiment, a process parameter is measured for each wafer in a lot. The process parameter may include any relevant process parameter for a semiconductor device, and in one specific example the process parameter includes a critical dimension. Critical dimension data for a given wafer can be used in subsequent processing steps for the wafer, and in the present embodiments, the critical dimension data is fed forward to a subsequent step, where the subsequent step may include any given step in the manufacturing process. In this specific example, the subsequent steps includes light doped drain implantation.

Continuing with the example, the process parameter may be measured directly or may be inferred from some other characteristic. In one example, the critical dimension data is inferred from a position of a wafer within a chamber during a deposition process, though the scope of embodiments is not so limited.

Process parameter data can then be analyzed and associated with particular processing instructions or recipes during a subsequent step. For instance, a value for critical dimension within a particular range may indicate that a light doped drain implantation process should take a certain amount of time. Wafer to wafer, as the critical dimension data varies from one range to another, so does a recommended or appropriate time for the implantation process.

Continuing with the example embodiment, the system has process parameter data for each of the semiconductor wafers, and the process parameter data indicates a particular recipe for a particular wafer in a subsequent step. The present embodiment then groups the semiconductor wafers into a multitude of groups, where each one of the groups is associated with a different recipe. Thus, the semiconductor wafers are grouped by process job, where in this example, a process job includes a discrete processing step or multiple substeps performed by a tool upon a wafer or wafers.

The semiconductor wafers can then be processed group-by-group, since the wafers within a single group are associated with the same recipe. In an example where a lot has twenty-five wafers, the lot may divided into twenty-five or fewer groups, depending on the recipe resolution for the tool. In some embodiments, the number of groups may be far fewer than the number of wafers in a lot (e.g., five groups versus twenty-five wafers), and in such embodiments, there can be a significant processing time savings compared to a system that processes the wafers one-by-one but no deleterious effect for wafer variation.

In one example, a semiconductor manufacturing facility includes a computer-controlled semiconductor manufacturing system, such as a Manufacturing Execution Systems (MES). The system includes one or more processor-based devices controlling a plurality of processing tools. At one or more processing steps, semiconductor wafers are grouped by process job, as described above. One or more computers receive and analyze the process parameters, group the wafers, and control the tools to apply appropriate recipes to the grouped wafers. For instance, in one embodiment, a computer-based system includes at least one processor that executes instructions to group the wafers by process job and to control a tool to process the wafers group-by-group.

Other embodiments include a computer program product having a computer readable medium tangibly recording computer program logic for controlling a semiconductor manufacturing process. The computer program product includes code to analyze the process parameters, group the wafers by process job in accordance with the analyzed process parameters, and process the wafers group-by-group.

Further in these examples, after the wafers have been processed group-by-group, some embodiments rejoin the wafers in the lot in preparation for additional process steps. Some of the additional process steps may include processing the wafers one-by-one or processing the lot as a whole. Still, other additional process steps may include grouping the wafers by process job in the same groups or different groups as those described above. Examples of processes include cleaning, deposition, etching, annealing, photolithography, cutting, and the like, and it is understood that various embodiments may be adapted to any appropriate process in a FFW system.

The following figures describe various embodiments in more detail. However, the scope of embodiments is not limited to lots of a particular size, groups of a particular size, a number of groups, or particular processing steps or parameters. Furthermore, various embodiments may be adapted for use in the manufacture of any kind of semiconductor device, such as processor chips, light-emitting diodes, light detecting devices, and the like.

FIG. 1 is an illustration of an exemplary FFW method 100 for manufacturing according to one embodiment. Method 100 may be performed in a manufacturing facility (a "fab") that uses a FFW technique.

An exemplary fab includes many different manufacturing machines, or tools. The tools are computer controlled so that each tool is usually associated with its own computer, and also, other larger computers monitor and control the tools. In some older fabs, human operators may assist in moving batches of wafers from tool to tool across the floor. However, in newer fabs, the manufacturing process may be almost completely free of human operators by utilizing an Automatic Material Handling System (AMHS).

Figure 4:
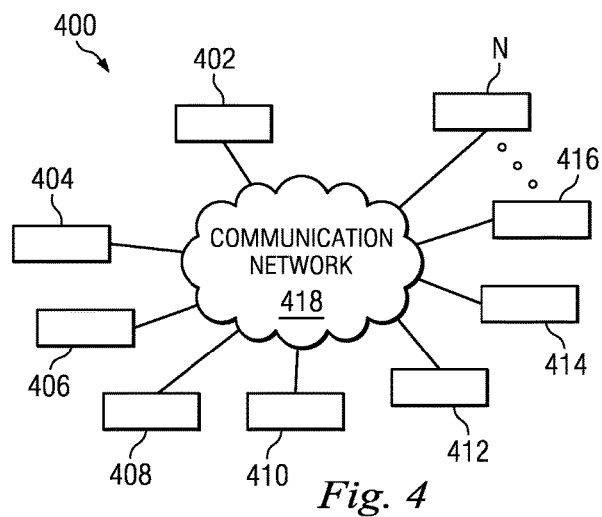
FIG. 4 is an illustration of an exemplary semiconductor manufacturing system in accordance with various aspects of the present disclosure.

A typical fab has numerous different processing tools. Each tool is usually associated with a specific type of process, such as etching, deposition, photolithography, thermal annealing, etc. In fact, for each different type of etching, deposition, photolithography, annealing, etc., a different tool may be used (e.g., separate etch tools from different vendors). For a wafer associated with a particular product, the wafer may be transported from tool to tool so that different types of processing steps may be performed to manufacture the wafer. FIG. 4 (described further below) provides an example fab, which may be adapted according to an embodiment.

Method 100 includes process step 1, a measuring step 101, and process step 2. It is understood that method 100 is greatly simplified, and that some methods in practice may include over one hundred separate process steps. Further in this example, process step 1 and process step 2 may be performed by different processing tools in the fab.

An example process step 1 includes a gate etch, though some embodiments may include other processes at process step 1. After process step 1 is performed, a process parameter is measured in step 101. As mentioned above, one example includes measuring a critical dimension on the wafer. For instance, a dimension of a gate stack may be referred to as a critical dimension. Dimensions of features may be measured using any technique now known or later developed, including, e.g., electron microscopy.

In another example, the process parameter may be measured by inference. For instance, in some systems, there is process variation within a batch of wafers during a process step that depends on the physical placement of a given wafer within the chamber of the tool. A process parameter may in some instances be inferred by the physical placement of a wafer or other known process phenomenon. Furthermore, the scope of embodiments is not limited to measuring a critical dimension, as any relevant process parameter may be measured.

In some embodiments, the measured dimension affects a subsequent process step, such as a source/drain implantation process. Thus, in method 100, the measured parameter data is fed forward to process step 2. The present embodiment adds step 102 to the FFW model. Specifically, method 100 groups wafers by process job before process step 2 is performed. Therefore, process step 2 is not performed wafer-by-wafer, as in some wafer-base methods (unless, of course, each wafer is assigned to a different group). Nor is process step 2 performed on the entire lot simultaneously, as in some lot-base methods (unless, of course, every wafer in the lot is in the same group).

Rather, method 100 performs process step 2 group-by-group. So if there are five groups, and if each process job takes one time unit, then process step 2 takes five time units. By contrast, a lot-base method would take about one time unit, and a wafer-base method would take about twenty-five time units (assuming that the lot has twenty-five wafers). However, method 100 would have a low process variation, similar to that provided by the wafer-base method, while taking much less time than the wafer-base method. It is understood that the above example using five groups and twenty-five wafers per lot is exemplary only, and various embodiments may include any appropriate number of groups or lot size.

Process 100 is shown in a simplified form. As mentioned above, real-life semiconductor manufacturing methods may include many more individual process steps in addition to process steps 1 and 2 and measuring step 101. Accordingly, some embodiments may perform feed-forward of parameter measurement data and process job grouping of wafers multiple times before the wafer is finished. Furthermore, while process 100 is shown as having a single measuring step feed data forward to a subsequent process step, it is understood that the scope of embodiments includes scenarios wherein multiple measuring steps feed data to a subsequent processing step. Thus, data from multiple measuring steps may be used to group wafers during one or more subsequent processing steps, especially in scenarios wherein a process condition is defined by multiple different data.

Figure 2:
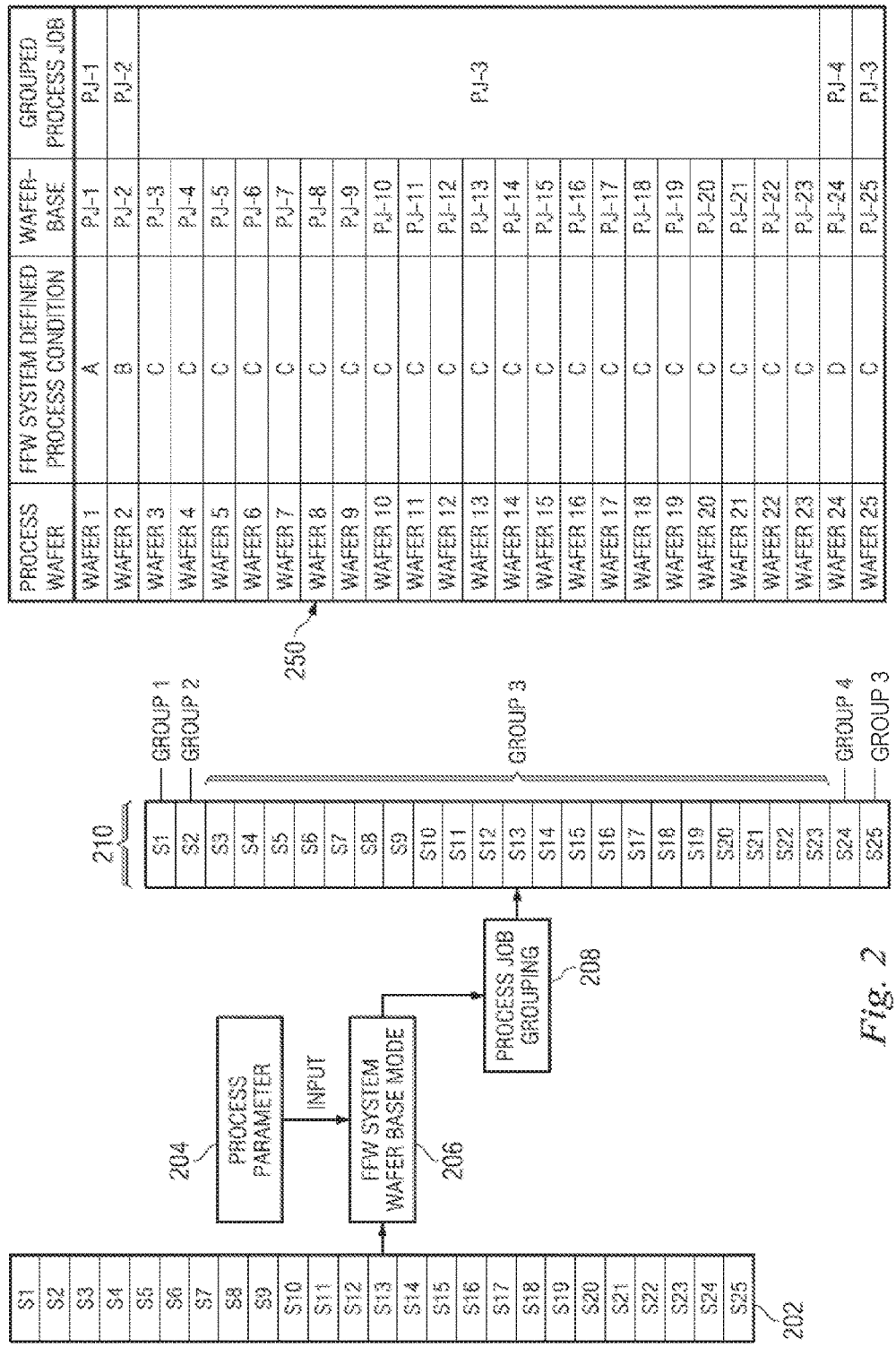
FIG. 2 is an illustration of a portion of the process of FIG. 1.

FIG. 2 is an illustration of a portion of exemplary process 100, applied to a specific example wafer lot 202, according to one embodiment. Wafer lot 202 includes twenty-five wafers S1-S25. The wafers of wafer lot 202 may be in any processing stage for the purposes of FIG. 2. In other words, the scope of embodiments includes applying feed-forward of data and process job grouping of wafers during any appropriate portion of a manufacturing process.

Continuing with the example of FIG. 2, process parameter data is acquired in block 204 and input into a FFW system in wafer-base mode in block 206. At block 206, each of the wafers in the lot 202 is associated with a process parameter value.

In block 208, process job grouping is applied to the wafers in lot 202. In one example, the logic of block 208 analyzes the process parameter data to discern a range that a given wafer's data falls in. For instance, a given system may have ten ranges, each of the ranges corresponding to a recipe in a subsequent processing step. The logic of block 208 analyzes the parameter data for each of the wafers and assigns a wafer to one of the groups according to a range that encompasses the wafer's data.

A total number of possible groups may be defined by a resolution of recipes. In another example, a number of possible groups is defined to be less than would otherwise be allowed by a resolution of recipes in order to reduce the maximum possible time to process the groups in a lot. In other examples, a number of possible groups may be defined according to limitations of a processing tool. Any appropriate possible number of groups is within the scope of embodiments.

Block 210 shows one example of how the wafers of lot 202 may be assigned to different groups. In this example, wafer S1 is assigned to group 1, wafer S2 is assigned to group 2, wafers S3-S23 and S25 are assigned to group 3, and wafer S24 is assigned to group 4. The particular example of FIG. 2 shows wafers assigned only to four different groups, though the number of possible groups may be much larger than four.

Table 250 shows an illustration of the groupings of the individual wafers of lot 202. Each one of the wafers is classified according to a system-defined process condition, which is another way of referring to a recipe for a particular process step. An example of a recipe for a particular processing step may include a value for a concentration of a dopant to be applied to a wafer, a value for a time duration of the process step, a value for an amount of material to be applied to a wafer, etc. There are four process conditions (A-D), just as there are four groups to which the wafers are assigned. The column labeled "wafer-base" shows how the wafers would be grouped in a true wafer-base system. In a true wafer-base system, each of the wafers would be assigned to its own processing job (PJ), even though many of the wafers correspond to the same process condition.

By contrast, in the present embodiment, each of the wafers is grouped according to process condition. Thus, for twenty-five wafers spanning four process conditions, there are four resulting process jobs. Accordingly, the present embodiment is more efficient than a true wafer-base technique without incurring an increase in process variation.

Figure 3:
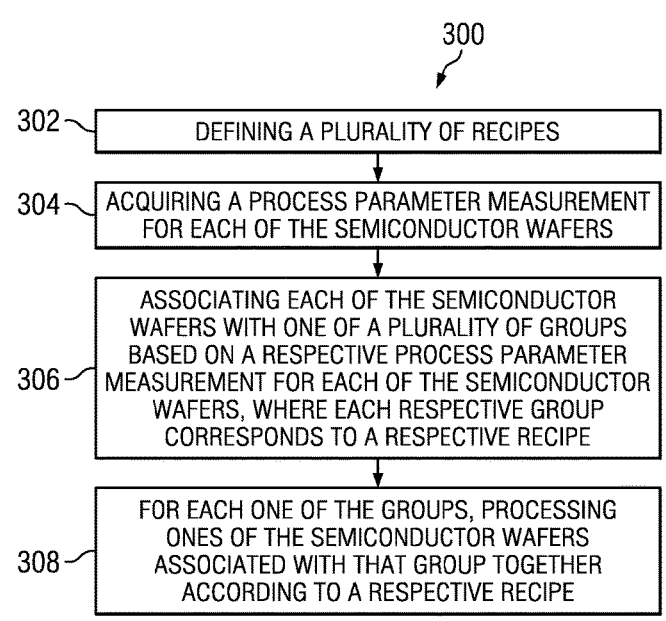
FIG. 3 is an illustration of a method for manufacturing semiconductor wafers in accordance with various aspects of the present disclosure.

FIG. 3 is an illustration of exemplary process 300, adapted according to one embodiment. Process 300 may be performed, for example, by a computer-controlled semiconductor manufacturing system that has one or more computers and one or more tools.

In block 302, a plurality of recipes are defined for a process step. As explained above, a number of possible recipes for a given step may be defined by a recipe resolution, a capability of a processing tool, a preference for fewer groups in order to reduce a process time, and/or the like.

In block 304, a process parameter measurement is acquired for each of the semiconductor wafers. The measurement may be made directly or by inference. In some examples where process variation is expected based on physical location of a wafer in a tool, process parameters may be inferred based on such physical location. In another similar embodiment direct measurements may be taken for fewer than all wafers, with values for other wafers being extrapolated based on measurements associated with nearby wafers.

In block 306, each of the semiconductor wafers is associated with one of a plurality of groups based on its respective process parameter measurement. The subset of groups applied to the individual wafers may be taken from a larger group of possible groups wherein each of the possible groups corresponds to one of the recipes of block 302.

In block 308, the wafers in a given group are processed together in that group. Each group is processed according to its respective recipe. Thus, each group is a process job into which wafers with similar process conditions are gathered.

Various embodiments may differ from that illustrated in FIG. 3. For instance, some embodiments may add, omit, rearrange, or modify one or more actions. In one example, method 300 is performed multiple times during the manufacture of a lot of wafers, so that wafers are grouped by process job for a plurality of subsequent process steps.

In yet another example, method 300 is performed with respect to a set of wafers different than a lot. For instance wafers from multiple lots may be grouped together during a grouping process in order to create larger process jobs and increase efficiency for the process as a whole.

FIG. 4 illustrates an example integrated circuit fabrication system 400 (in this embodiment, an MES). The fabrication system 400 includes a plurality of entities 402, 404, 406, 408, 410, 412, 414, 416 . . . , N that are connected by a communications network 418. The network 418 may be a single network or may be a variety of different networks, such as an intranet and the Internet, and may include both wire line and wireless communication channels.

In an embodiment, the entity 402 represents a service system for manufacturing collaboration, the entity 404 represents a user, such as product engineer monitoring the interested products; the entity 406 represents an engineer, such as a processing engineer to control process and the relevant recipes, or an equipment engineer to monitor or tune the conditions and setting of the processing tools; the entity 408 represents a measurement tool; the entity 410 represents a semiconductor processing tool; the entity 412 represents a virtual metrology module associated with the processing tool 410; the entity 414 represents an advanced processing control module associated with the processing tool 410 and additionally other processing tools, and the entity 416 represents a sampling module associated with the processing tool 410.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 414 may include a plurality of computer readable media having software instructions encoded thereon. The computer readable media may include hard drives, flash drives, CD-ROMs, RAM memory, display devices (e.g., monitors), input/output device (e.g., mouse and keyboard), and the like. The software instructions may be written in any suitable programming language and may be designed to carry out specific tasks, such as the tasks associated with feeding process parameters forward and grouping wafers with similar process conditions into process jobs. In various embodiments, each of the modules 408, 410, 412, 414, 416 may include a processor operable to perform instructions read from a computer readable medium that has software instructions encoded thereon.

In the embodiment of FIG. 4, one or more processors associated with one or more of modules 408, 410, 412, 414, 416 may perform actions described above with reference to FIGS. 1-3. Thus, one embodiment may include one or more processors operable to analyze process parameter data and assign the wafers to different groups for processing based on the process parameter data. The same or different one or more processors may then initiate the processing group-by-group by one or more of the tools according to recipes associated with each of the groups. Furthermore, the same or different one or more processors may supervise the process as a whole, including multiple process steps and even multiple FFW steps, if appropriate.

The integrated circuit fabrication system 400 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to measurement results, such as the process parameter data. In one embodiment, the measurement results are gathered from a subset of wafers according to an optimal sampling rate determined based on the process quality and/or product quality. In another embodiment, the measurement results are gathered from chosen fields and points of the subset of wafers according to an optimal sampling field/point determined based on various characteristics of the process quality and/or product quality. In yet another embodiment, the measurement results include measurements taken directly from each wafer or inferred from each wafer or a subset of the wafers.

Various embodiments may include one or more advantages over some conventional techniques. For instance, in some embodiments process variation is minimized by providing a recipe at a subsequent process step for each individual wafer of a lot. However, efficiency of such embodiment is higher than that expected of true wafer-base processes because the number of process jobs per lot may be smaller than a number of wafers in the lot. Furthermore, various embodiments may be implemented in existing FFW systems by updating process software to perform process job grouping of wafers in a manner as a described above with respect to FIGS. 1-4.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for processing a plurality of semiconductor wafers, the method comprising:
    performing a first fabrication process on each of the semiconductor wafers within a lot according to a first order;
    after the performing of the first fabrication process, acquiring critical dimension data for each of the semiconductor wafers within the lot wherein critical dimension data of a first subset of the semiconductor wafers are measured directly with a measurement tool and critical dimension data of a second subset of the semiconductor wafers are extrapolated from the critical dimension data of the first subset of the semiconductor wafers;
    classifying the semiconductor wafers within the lot into a plurality of groups based on the critical dimension data acquired for each of the semiconductor wafers, each group including one or more semiconductor wafers, wherein each group corresponds to a different process condition; and performing a second fabrication process on each of the plurality of groups in the lot according to the process condition that corresponds to that group, the second fabrication process being different from the first fabrication process, wherein the performing of the second fabrication process includes, for each one of the groups, processing the semiconductor wafers associated with that group together, such that a second order by which the semiconductor wafers are processed in the second fabrication process is different from the first order.

2. The method of claim 1 in which the method is implemented in a feed forward process.

3. The method of claim 1 in which the lot comprises twenty-five semiconductor wafers.

4. The method of claim 1 in which measuring the critical dimension data of the first subset of the semiconductor wafers includes directly measuring critical dimension data of each of the semiconductor wafers in the first subset with an electron microscope.

5. The method of claim 1 in which acquiring the critical dimension data of the semiconductor wafers comprises measuring dimension of gate stacks of the semiconductor wafers in the first subset and extrapolating dimension of gate stacks of the semiconductor wafers in the second subset from the dimension of gate stacks of the semiconductor wafers in the first subset.

6. The method of claim 1 further comprising defining a plurality of distinct recipes according to at least one of a recipe resolution and a limitation of a processing tool for performing the second fabrication process, wherein each of the plurality of distinct recipes corresponds to one of the plurality of groups.

7. The method of claim 1 in which the first fabrication process is a gate etch process and the second fabrication process is a doping process.

8. A method for manufacturing a plurality of semiconductor wafers, the method comprising:
receiving a lot of semiconductor wafers;
performing a first fabrication process on the lot of semiconductor wafers using a first processing tool, wherein the first fabrication process is a gate etch process;
determining a total number of different groups for dividing the semiconductor wafers within the lot, wherein the total number of different groups is defined by a number of different process conditions for performing a subsequent fabrication process different from the first fabrication process, wherein the subsequent fabrication process is a doping process, wherein the different process conditions correspond to different concentrations of a dopant to be applied to each of the semiconductor wafers during the subsequent fabrication process, and wherein the total number of different groups is greater than one;
after the performing of the first fabrication process, generating process parameter data for each of the semiconductor wafers within the lot based on a measurement acquired for each of the semiconductor wafers, wherein the measurement includes a dimension of gate stacks formed on each of the semiconductor wafers, the process parameter data for a respective semiconductor wafer corresponding to one of the different process conditions in the subsequent fabrication process;
dividing the lot of semiconductor wafers into the total number of different groups based on the dimension of the gate stacks formed on each of the semiconductor wafers; and
processing the lot of semiconductor wafers group-by-group in the subsequent fabrication process using a second processing tool.

9. The method of claim 8 in which each group corresponds to a different processing job.

10. The method of claim 8 in which at least one of the groups includes more than one of the semiconductor wafers.

11. The method of claim 8 in which the generating the process parameter data includes
directly measuring the process parameter data of a first subset of the semiconductor wafers; and
extrapolating the process parameter data of a second subset of the semiconductor wafers from the process parameter data of the first subset of the semiconductor wafers.

12. The method of claim 11 in which the directly measuring the process parameter data includes measuring dimension of gate stacks of each of the semiconductor wafers in the lot using an electron microscope.

13. The method of claim 8 in which the process parameter data includes data from at least one process step in a feed forward manufacturing system.

14. The method of claim 8 in which the total number of different groups is less than a total number of the semiconductor wafers in the lot.

15. The method of claim 8 in which the generating process parameter data includes acquiring the process parameter data based on a physical location of each of the semiconductor wafers in the first processing tool.

16. A computer program product having a non-transitory computer readable medium tangibly recording computer program logic for controlling a semiconductor manufacturing process, the computer program product comprising:
code to analyze critical dimension data for each of a plurality of semiconductor wafers within a lot after performing a first fabrication process to the semiconductor wafers, wherein the first fabrication process is a gate etch process, and wherein the critical dimension data of a first subset of the semiconductor wafers are measured directly with a measurement tool and the critical dimension data of a second subset of the semiconductor wafers are extrapolated from the critical dimension data of the first subset of the semiconductor wafers;
code to associate each of the semiconductor wafers with one of a plurality of groups based on a range of the critical dimension data, wherein each one of the groups is to be processed with a different recipe in a subsequent processing step, and wherein the different recipe corresponds to a different dopant concentration to be applied to the semiconductor wafers in each one of the groups; and
code to process the semiconductor wafers in the subsequent processing step group-by-group such that at least two semiconductor wafers are processed in the subsequent processing step in an order that is different from an order of the processing of the at least two semiconductor wafers in the first fabrication process.

17. The computer program product of claim 16 in which a number of the plurality of groups is smaller than a number of the semiconductor wafers in the lot.

18. The computer program product of claim 16 further comprising:
code to feed the critical dimension data from a first processing step to the subsequent processing step.

19. The computer program product of claim 16 in which each of the groups corresponds to a process job for a processing tool for performing the subsequent processing step.

20. The computer program product of claim 16 in which the measurement tool is an electron microscope.

* * * * *